United States Patent
Westphal et al.

(10) Patent No.: US 6,667,619 B2
(45) Date of Patent: Dec. 23, 2003

(54) MAGNETIC RESONANCE APPARATUS WITH DAMPING OF INNER MECHANICAL VIBRATIONS

(75) Inventors: Michael Westphal, Offenbach (DE); Hartmut Schmidt, Karlsruhe (DE)

(73) Assignee: Bruker BioSpin GmbH, Rheinstetten (DE)

( * ) Notice: Subject to any disclaimer, the term of this patent is extended or adjusted under 35 U.S.C. 154(b) by 0 days.

(21) Appl. No.: 10/108,499

(22) Filed: Mar. 29, 2002

(65) Prior Publication Data

US 2002/0140428 A1 Oct. 3, 2002

(30) Foreign Application Priority Data

Apr. 3, 2001 (DE) .......................... 101 16 623

(51) Int. Cl.[7] ................................. G01V 3/00
(52) U.S. Cl. ...................................... 324/318
(58) Field of Search ................ 334/307, 309, 334/318, 322; 324/307, 309, 318, 322

(56) References Cited

U.S. PATENT DOCUMENTS

| | | | | |
|---|---|---|---|---|
| 4,652,824 A | * | 3/1987 | Oppelt ........................ 324/318 |
| 4,878,024 A | * | 10/1989 | Overweg et al. .......... 324/319 |
| 5,235,283 A | | 8/1993 | Lehne |
| 5,256,969 A | | 10/1993 | Miyajima |
| 5,530,355 A | * | 6/1996 | Doty .......................... 324/318 |
| 5,552,709 A | * | 9/1996 | Anderson .................. 324/321 |
| 5,617,026 A | * | 4/1997 | Yoshino et al. ............ 324/318 |
| 5,764,059 A | * | 6/1998 | Mansfield et al. .......... 324/318 |
| 5,986,453 A | * | 11/1999 | Anderson et al. .......... 324/300 |
| 6,054,855 A | * | 4/2000 | Anderson .................... 324/318 |
| 6,326,788 B1 | * | 12/2001 | Mulder et al. .............. 324/318 |
| 6,469,604 B1 | * | 10/2002 | Palkovich et al. ........... 335/216 |
| 6,501,275 B1 | * | 12/2002 | Westphal .................... 324/319 |

FOREIGN PATENT DOCUMENTS

| | | |
|---|---|---|
| GB | 2 356 056 | 5/2001 |
| WO | WO 00/25 146 | 5/2000 |

OTHER PUBLICATIONS

U.S. patent application Ser. No. 09/663,789, Westphal.

* cited by examiner

*Primary Examiner*—Edward Lefkowitz
*Assistant Examiner*—Dixomara Vargas
(74) *Attorney, Agent, or Firm*—Paul Vincent

(57) ABSTRACT

In a magnetic resonance (MR) apparatus comprising a main field magnet system with a tubular opening for receiving the object to be investigated and at least one tubular mechanically oscillatory component, disposed in this opening, in particular a gradient coil system, and at least one cylindrical element of electrically conducting material surrounded by the main field magnet system, which is rigidly mechanically connected to at least one of the mechanically oscillatory components or forms an integral mechanical component thereof, the sum of the products p of the electric conductivities $\sigma$, the cylinder radii R and the wall thicknesses d of the cylindrical element per mechanically oscillatory component is between 1 Am/V and 10,000 Am/V, preferably between 10 Am/V and 1000 Am/V, and particularly preferred between 20 Am/V and 500 Am/V. This produces good noise damping in an inward direction.

25 Claims, 5 Drawing Sheets

MAGNETIC RESONANCE APPARATUS WITH DAMPING OF INNER MECHANICAL VIBRATIONS

This application claims Paris Convention priority of DE 101 16 623.0 filed Apr. 3, 2001, the complete disclosure of which is hereby incorporated by reference.

BACKGROUND OF THE INVENTION

The invention concerns a magnetic resonance (MR) apparatus comprising a main field magnet system with a tubular opening for receiving the object to be examined, and at least one mechanically oscillatory tubular component which is disposed in this opening, in particular a gradient coil system, and at least one cylindrical element of electrically conducting material which is surrounded by the main field magnet system and which is rigidly mechanically connected to at least one of the mechanically oscillatory components or which forms an integral mechanical part therewith.

An arrangement of this type is known from WO 00/25146 A1.

An MR apparatus for medical purposes is used i.e. for producing cross-sectional images of a body. Towards this end, a strong, constant and uniform magnetic field is generated in an investigational volume of the MR apparatus. A gradient field is superposed on the uniform field to determine the location to be recorded. An RF field then excites the atoms of the sample substance located in the investigational volume and the spin resonance signal which is produced during relaxation of the excited atoms is used to reconstruct an image of the cross-section which was defined by the gradient field. The constant uniform field is generated by a main field magnet which may be superconducting. The main field magnet has, together with the associated covering, a tubular opening in which the investigational volume is disposed. The diameter of this tube is determined by the size of the patient to be examined and therefore has a predetermined minimum value, e.g. 90 cm.

The gradient system for producing the magnetic gradient field in the investigational volume is disposed within the above-mentioned tube and about the investigational volume. The gradient system comprises gradient coils for generating a gradient field. Gradients are generated for each of the three coordinate directions x, y and z. During the measurement, current pulses are fed to the gradient coil which produces structure-borne noise in the gradient system due to the Lorentz forces acting on the gradient coils in the strong background field of the main field magnet. This structure-borne noise is irradiated from the surfaces of the gradient system in the form of acoustical noise. To prevent such irradiation, a preferred embodiment of WO 00/25146 A1 discloses a gradient system surrounded by an evacuated capsule which is connected, in a vacuum tight manner, to a tubular access to the working volume and to the tube of the main field magnet on the side of the gradient system facing away from the working volume. The tube therefore forms part of the capsule.

The above-mentioned feeding of the gradient coils with current pulses can also produce stray magnetic fields of a greater or lesser strength radially outside of the gradient system, i.e. in the region of the main field magnet. These stray fields can induce eddy currents in the electrically conducting parts of the MR apparatus which are disposed in the vicinity of the gradient coils, in particular the metallic parts provided for producing the main field. Examples thereof are the tubular part of the covering of the coil system, any thermal shielding (for a superconducting coil system) provided within the covering, and the magnet field coil itself. The magnetic fields produced by the eddy currents generate considerable noise since the parts which conduct the eddy currents are also subjected to Lorentz forces in the background field of the main field magnet which produce structure-borne noise and transfer it to the capsule.

To counteract this, attempts have been made to shield or compensate the magnetic fields which are produced outside of the investigational volume. A shielding coil has been provided which surrounds the gradient coil to compensate for the stray fields. This shielding coil is intended to actively shield the space outside of the investigational volume through generation of a compensating field. However, complete shielding is not possible with a shielding coil since the shielding coil is formed of discrete windings and deviations cannot be avoided due to production tolerances such that magnetic flux can escape outwardly through the windings.

To improve active shielding, WO 00/25146 proposes providing the gradient system with an additional eddy current shielding consisting of an electrically conducting, substantially closed cylindrical element. The gradient coil system and the shielding coil are disposed within the cylindrical element to form a mechanically rigid unit therewith. In consequence thereof, the parasitic fields of the gradient coils build up and decay slowly when current pulses are input. For this reason, only weak eddy currents, and resulting mechanical oscillations and structure-borne noise, are excited in the electrically conducting parts of the main field magnet. The function of the arrangement improves, the larger the product p of the electric conductivity, the wall thickness d and the radius R of the cylindrical element. In one embodiment, the product p=80000 A mN. This embodiment of WO 00/25146 advantageously effects an additional reduction in noise over and above that already given through the conventional use of an evacuated capsule which completely surrounds the gradient system.

One substantial disadvantage of the use of an evacuated capsule is that the production of a capsule of this type is relatively difficult, since a gradient system has numerous supply lines such as current cables and lines for cooling water which must be guided through the capsule in a vacuum-tight fashion and in such a manner that no structure-borne noise is transmitted at the vacuum-tight feed-throughs via these lines from the mechanically oscillating gradient system to the capsule.

It is therefore the object of the invention to further develop an MR apparatus of the above-mentioned type with as simple technical means as possible such that the noise of oscillatory components can be effectively reduced to make an MR recording more convenient for the patient.

SUMMARY OF THE INVENTION

This object is achieved in accordance with the invention in a surprisingly simple and technically straightforward manner in that the sum of the products p of the electrical conductivities σ, the cylinder radii R and the wall thicknesses d of the cylindrical element per mechanically oscillatory component is between 1 Am/V and 10,000 Am/V, preferably between 10 Am/V and 1000 Am/V, and particularly preferably between 20 Am/V and 500 Am/V.

A cylindrical element which meets these requirements has relatively poor electrical conductivity. In general, mechanical oscillations in the background field of the main field magnet induce eddy currents in a cylindrical element of a greater or lesser strength having the frequency of the mechanical oscillation which fundamentally damp the original mechanical oscillation in accordance with Lenz's Law. This can be achieved in a practically useful fashion only if the cylindrical element meets the cited requirements. Since the cylindrical element is rigidly mechanically connected to an oscillatory component, in particular the gradient system, the mechanical oscillations of the oscillatory component, in particular of the gradient system, are damped.

Contrary to prior art described in WO 00/25146, vibration of the cylindrical element of the inventive MR apparatus is optimally damped, whereas in WO 00/25146 the rise-time or the decay-time of parasitic magnetic fields of the gradient system in the region of the main field magnet is as slow as possible. It is not possible to achieve both aims with the same arrangement. In e.g. patent application U.S. Ser. No. 09/663,789 filed Sep. 18, 2000, a value for the product p of at least 20,000 Am/V, preferably 40,000 Am/V is stated for the shielding cylinder. For the shielding cylinder of WO 00/25146, a value p of approximately 80,000 Am/V can be calculated for the copper and aluminum materials, which are mentioned therein as being particularly suitable. In contrast to the inventive cylinder elements, these shielding cylinders must therefore have high conductivity and large cylinder thickness. From the stated products p of the prior art shielding cylinders, it is clear that the shielding cylinders described therein achieve a completely different technical object than the cylindrical element of the inventive MR apparatus and are not suitable to achieve the object of the present invention.

The inventive solution is mainly and particularly effective for high field magnets with magnetic flux densities >3 Tesla. The Lorentz forces which occur with these high flux densities produce a particularly large amount of noise in an MR apparatus. This noise is strongly damped by the inventive modification of the MR apparatus.

It must be noted that the cylindrical elements not only include cylinders in a strict mathematical sense but also other geometrical shapes. Cones, double cones, partial cones and spherical shapes can also be used.

In a preferred embodiment of the inventive MR apparatus, the mechanically oscillatory component and the cylindrical element are cast with a solidified and hardened casting compound to form one single mechanical unit. In this fashion, the mechanical connection between the cylindrical element and the oscillatory component is particularly good.

An advantageous further development is characterized in that the casting compound is a hardened artificial resin which is reinforced with fiber glass or carbon fibers. This produces a particularly hard mechanical connection between the cylindrical element and the mechanically oscillatory component using well-tested technology.

It is particularly advantageous if at least one cylindrical element contains carbon fiber material, in particular is formed of carbon fiber material. Carbon fibers have low electrical conductivity, good acoustical damping properties and high mechanical stability. For this reason they are particularly well suited for use as the cylindrical element.

An alternative embodiment of the invention is characterized in that at least one cylindrical element consists of a metal alloy, in particular a copper or aluminum alloy or of non-magnetic steel. These materials have relatively low electrical conductivity and can be produced with small wall thicknesses without significant technical effort.

In a particular embodiment, the cylindrical element is a seamless metal pipe. In this manner, there are no seams to impair the generation of the compensating eddy currents and to reduce the effectivity of the cylindrical element. Construction of at least one cylindrical element of several radially sequential layers also produces a highly effective damping of the parasitic magnetic fields. The layered construction also produces optimized mechanical damping of noise.

In a preferred further development, the cylindrical element consists of a metal foil which is wound in several layers. This is a particularly simple production method for the cylindrical element which does not loose its damping effect due to the inductive coupling of the different layers even if the layers, which are wound on top of each other, have no electrical contact. The inductive coupling of such a cylindrical element to the main field magnet is thereby small. Advantageously, gradient coils comprising such a cylindrical element can be installed and removed from a charged main field magnet without excessive magnetic forces. The metal foil is preferably wound around the mechanically oscillatory component.

In an alternative embodiment, the cylindrical element consists of several separate metal sheets which overlap each other through large areas. The advantages are similar to those of a cylindrical element which consists of a metal foil wound in several layers.

In a particularly preferred alternative embodiment, the cylindrical element is constructed from a multi-layer plastic compound with embedded electrically conducting structures. The production of a cylindrical element from this material is particularly simple. Selection of the plastic compound can effectively tailor the cylindrical element to the particular oscillatory component which is to be damped.

If a cooling means for cooling at least one cylindrical element is provided, the cylindrical element can have a very thin wall without being thermally damaged when carrying high eddy currents.

In a further embodiment of the inventive MR apparatus, at least one cylindrical element is rigidly mechanically connected to the gradient coil system of the MR apparatus. The forces caused by the gradient coil system therefore produce only a slight deformation of the rigid arrangement, but no shift of individual components leading to the possible production of noise.

It is particularly advantageous when the cylindrical element is in thermal contact with a gradient coil system cooling means. The cooling means of the gradient coil system can thereby be simultaneously used for cooling the cylindrical element. A separate cooling device for the cylindrical element is not required.

In a preferred further development, several cooling means are provided for the gradient coil system and each cooling means is in thermal contact with a respective cylindrical element. Such an arrangement can produce effective damping and simultaneously highly-effective cooling of the cylindrical elements.

When the cylindrical element is disposed radially outside of the gradient coils of the gradient coil system, the size of the investigational region is not impaired thereby. A particularly advantageous and surprising feature of this arrangement consists in that the damping effect caused by arrangement of the cylindrical element outside of the noise-producing gradient coils, acts in an inward direction i.e. into the investigational region such that there is hardly any noise in this region.

In a preferred embodiment, the gradient coil system is actively shielded by a shielding coil system. A radially inner gradient coil is thereby surrounded by a radially outer coil whose conductor paths are disposed such that the overall field of this arrangement theoretically completely or at least approximately vanishes throughout the region beyond the shielding coil.

A further embodiment of the invention is characterized in that the shielding coil system is rigidly mechanically connected to the gradient coils and the cylindrical element is disposed radially outside of the shielding coil system. This produces particularly good noise damping outside the main field magnet and also inside the investigational region. This arrangement is particularly advantageous in that in this case, only the eddy currents produced by the mechanical oscillations which, in turn, damp these oscillations occur in the cylindrical element and theoretically no eddy currents are directly induced by feeding the gradient coils with current pulses.

In a particularly preferred embodiment, at least one cylindrical element is rigidly mechanically connected to a sound-absorbing tubular capsule which completely or partially radially and/or axially surrounds a gradient coil system of the MR apparatus. The tubular capsule can be filled with air or can be evacuated. If it is evacuated, the sound waves are not transmitted. Moreover, the gradient system itself can be damped and/or be elastically disposed to prevent oscillations of the gradient system from being passed on to bordering structures.

In a particularly advantageous fashion, the cylindrical element itself is a mechanically oscillatory component and is disposed radially inside a gradient coil system of the MR apparatus. Such a cylindrical element can e.g. be simply introduced into the investigational region of existing MR apparatus. Existing MR apparatus can be easily retrofitted and new MR apparatus do not require any additional constructive effort to produce an investigational region in the MR apparatus with suppressed noise.

Further advantages can be extracted from the drawing and the description. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and is further explained by means of embodiments.

DESCRIPTION OF THE PREFERRED EMBODIMENT

Figure 1:
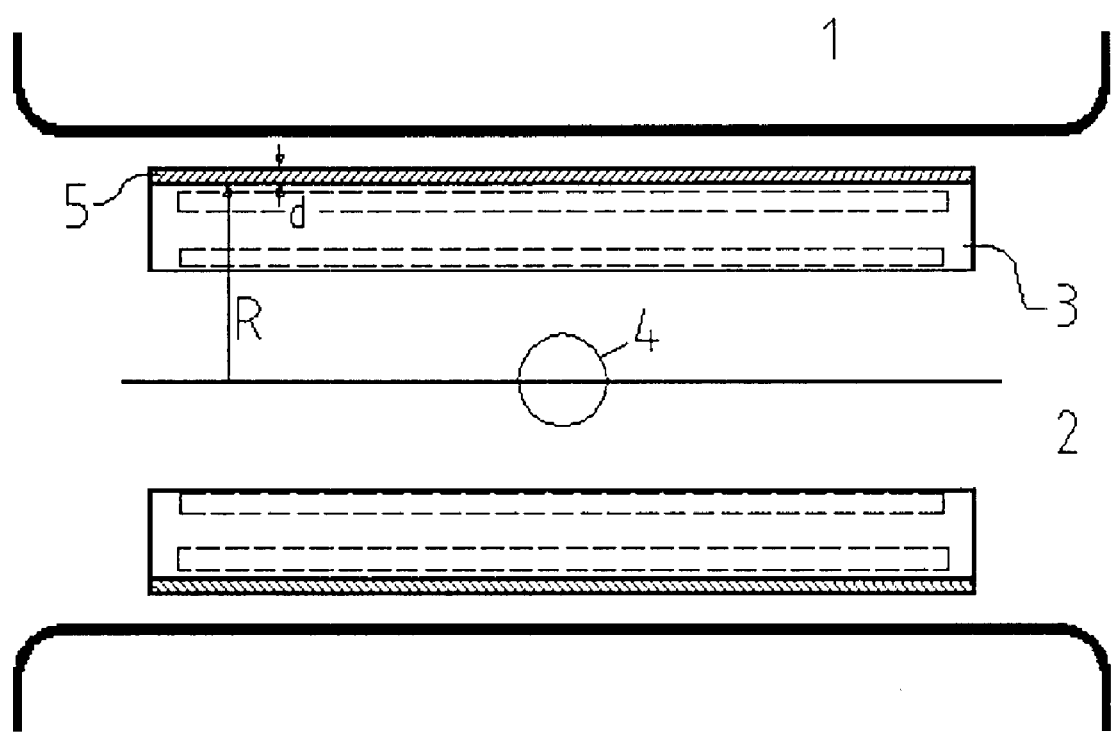
FIG. 1 shows a section through an inventive MR apparatus with a first arrangement of the cylindrical element.

FIG. 1 shows a longitudinal section through an MR apparatus 1. The MR apparatus 1 comprises a tubular opening 2 in which oscillatory components 3 are disposed. In FIG. 1 the oscillatory component 3 is a gradient coil. The oscillatory component 3 surrounds an investigational volume 4. It is rigidly mechanically connected to a cylindrical element 5 which is disposed radially outside of the oscillatory component 3. The cylindrical element has a radius R and a wall thickness d. When a gradient is switched, the cylindrical element moves with the oscillatory component (the gradient system). This motion of the cylindrical element in the strong background field of the main field magnet induces eddy currents in the electrically conductive cylindrical element. Due to the relatively poor electrical conductivity of the cylindrical element, characterized by the specified range for the product p, mechanical damping of the oscillatory component is optimized such that the noise in the investigational volume 4 is significantly reduced. This is associated with the development of heat and a temperature rise in the cylindrical element.

Figure 2:
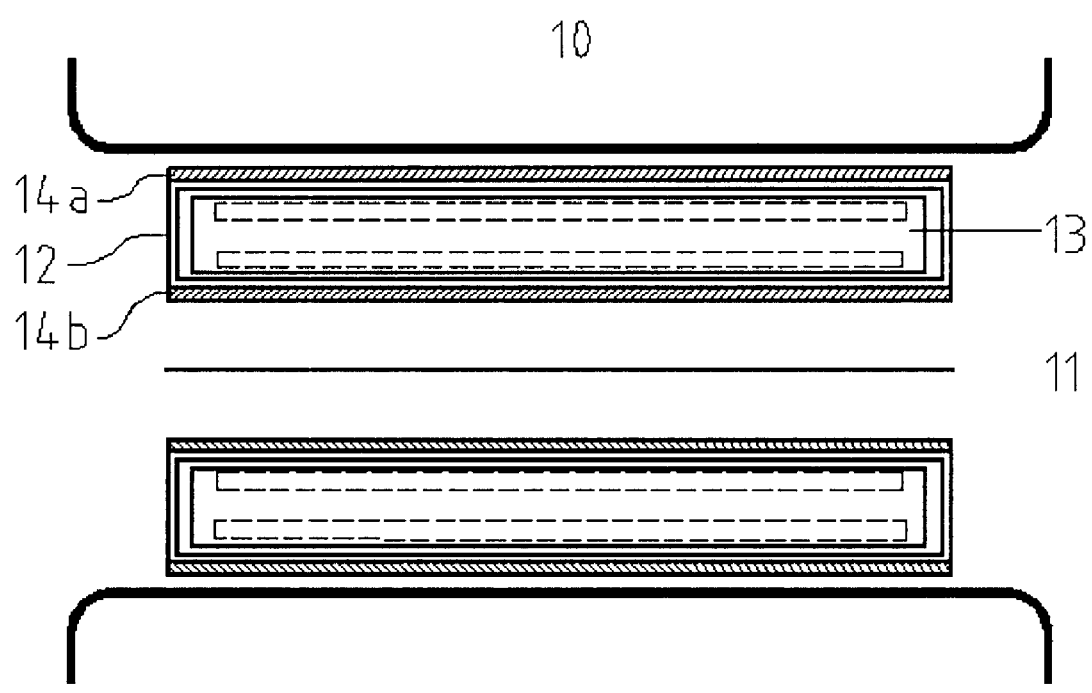
FIG. 2 shows a section through an inventive MR apparatus with a second arrangement of the cylindrical element.

FIG. 2 shows an alternative embodiment of an MR apparatus 10. The tubular opening 11 contains an oscillatory component 12 which is formed as a sound-absorbing tubular capsule. A gradient coil 13 is disposed inside the oscillatory component 12. The oscillatory component 13 is rigidly connected to a cylindrical element 14a and 14b.

Figure 3:
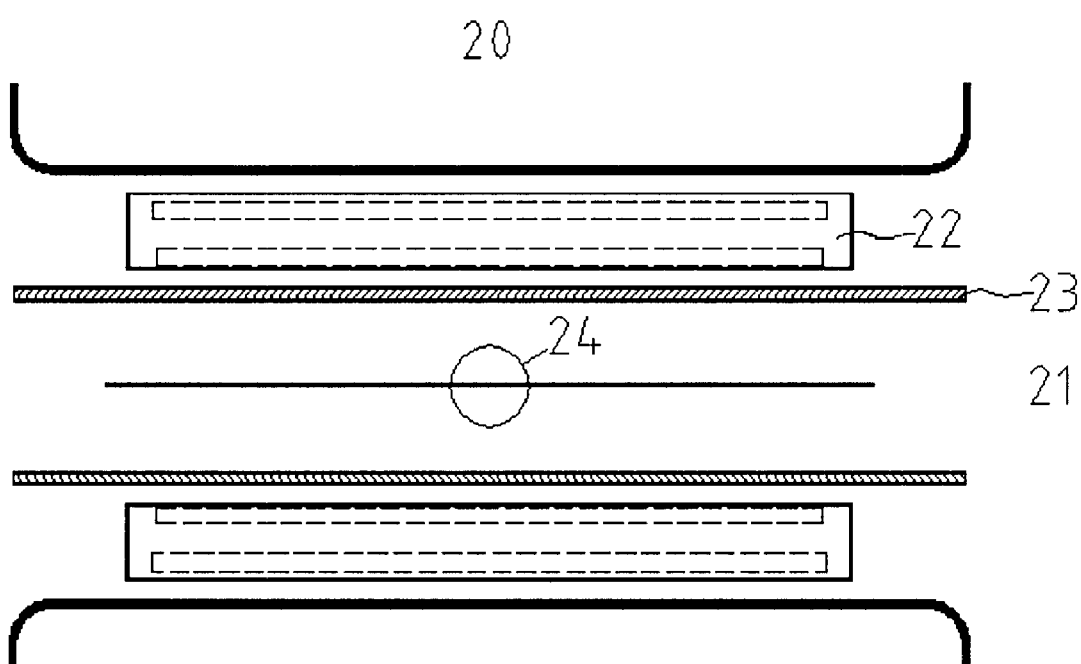
FIG. 3 shows a section through an inventive MR apparatus with a third arrangement of the cylindrical element.

A further alternative embodiment of an MR apparatus 20 is shown in FIG. 3. In this embodiment, a gradient coil 22 is provided in a tubular opening 21. A cylindrical element 23 is inserted into the tubular gradient coil 22 which also represents, in this case, the oscillatory component being damped. The noise in the investigational volume 24 is considerably reduced by this arrangement.

Figure 4:
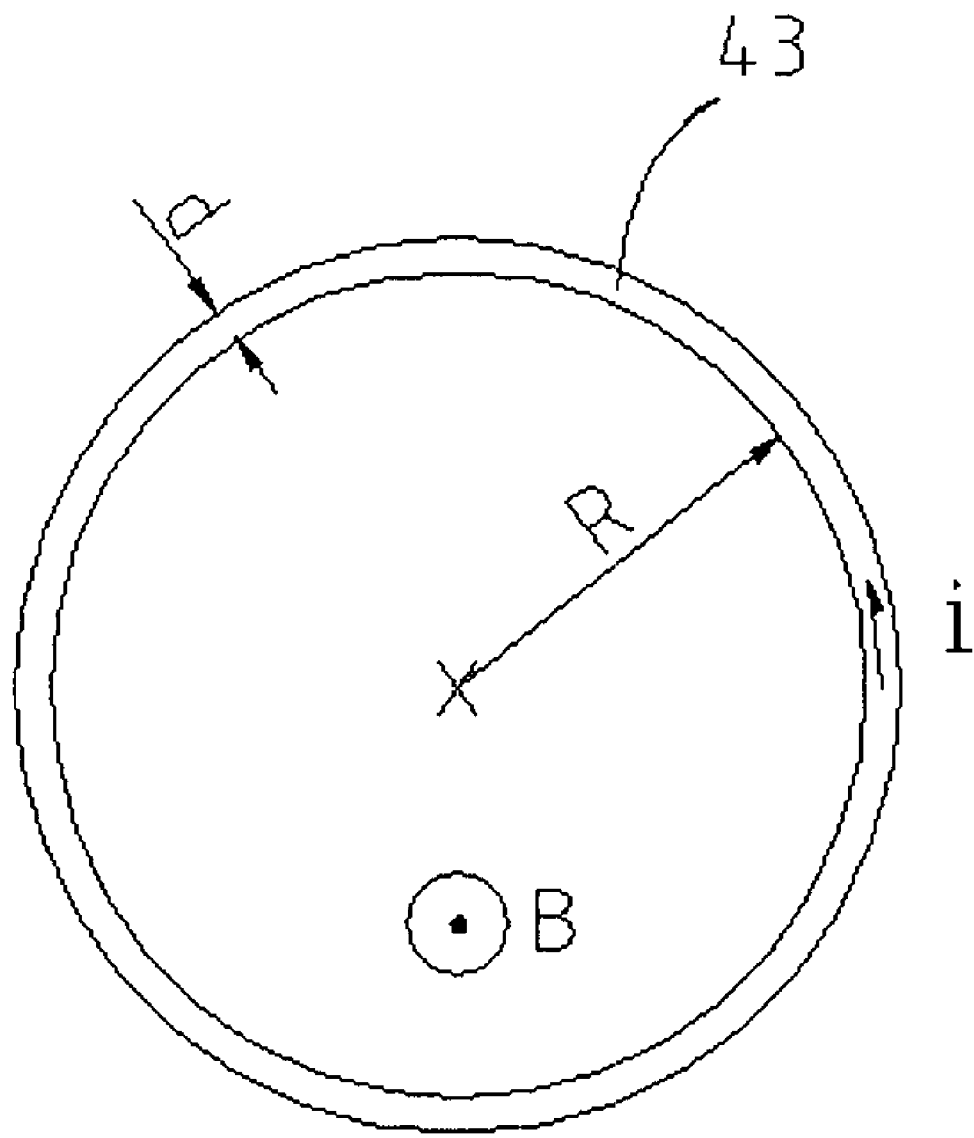
FIG. 4 shows a cross-section of a cylindrical element.

The damping effect of an electrically conducting cylindrical element is explained below on the basis of the cross-section shown in FIG. 4. The cylindrical element 43 is disposed in the magnetic field of a main field magnet with the magnetic induction B in the direction of the axis out of the plane of the drawing. It exercises a radial oscillation due to the rigid connection to an oscillatory component. The change of the radius caused by the oscillation as a function of time t is r(t). An electric current i(t) is thereby induced in the peripheral direction. In accordance with the law of induction:

$$d\Phi/dt = 2\pi BR\, dr/dt + R^2 \pi dB/dt = -R^* i(t),$$

and Ampère's law (time derivative)

$dB/dt = (1/l)\,\mu_0\, di/dt$: time derivative of the induction caused by the current i. Ampere's law is valid in this form only for a cylindrical element of infinite length l.

$\Phi$: magnetic flux enclosed by the cylindrical element, $R^*$: electrical resistance of the cylindrical element in the peripheral direction.

We obtain the following relationship between the temporal dependence of the radial oscillation r(t) and the induced current i(t):

$$2\pi BR\, dr/dt = -L\, di/dt - R^* i(t)$$

L: Inductance of the cylindrical element.

For sinusoidal oscillations of frequency f or of angular frequency ω the following relationship obtains (complex notation for r(t) and i(t)):

$$i0 = -(j\omega 2\pi BR)/((j\omega L + R^*))r0),$$

i0, r0: complex amplitudes, the magnitudes corresponding to the respective peak values, j: imaginary number of magnitude 1.

The electrical power loss relative to the length l is therefore:

$$P=(½)R^*i0^2/l=(2\pi/\lambda_0)B^2r0^2\omega_0\omega^2/(\omega^2+\omega_0^2),$$

with: $\omega_0=R^*/L$.

In case of sufficiently long cylindrical elements:
$\omega_0=2/(\mu_0 \sigma R\ d)$.

Selection of the electrical conductivity σ and the wall thickness d of the cylindrical element permits setting of $\omega_0$ within wide limits. The electrical power loss P which causes damping of the oscillation reaches a maximum when $\omega_0$ equals ω. ω is thereby the angular frequency of the mechanical oscillation and is usually equal to the angular frequency of a mechanical resonance. Typical values for mechanical resonance frequencies f=ω/(2π) are between 500 Hz and 5000 Hz. This produces the surprisingly small values (compared to WO 00/25146) for the product p of the radius R, the wall thickness d and the electrical conductivity σ of the cylindrical element.

The mechanical oscillation of the entire oscillatory component is a source of stored elastic energy. The following holds true for the instantaneous value W(t) of the stored energy per unit of length:

$$W(t)=(½)G\ r^2(t)$$

G=2π D E/R2: Spring constant per unit of length for radial oscillations,
D: Wall thickness of the oscillatory component,
E: average modules of elasticity of the oscillatory component,
R2: average radius of the oscillatory component.

The average stored energy W per unit of length of an oscillation which is initially assumed to be undamped is:

$$W=\pi\ D\ E\ r0^2/(2R2).$$

With an oscillation which is damped exclusively by the eddy currents in the cylindrical element, the average stored energy W is initially reduced with the power P. For the temporal reduction of the stored energy, a time constant T1= W/P results. For the temporal reduction of the amplitude r(t) of the oscillation, the time constant T2 is exactly twice as large:

$$T2=D\ E\ \mu_0(\omega^2+\omega_0^2)/(2R2B^2\omega_0\omega^2).$$

Figure 5:
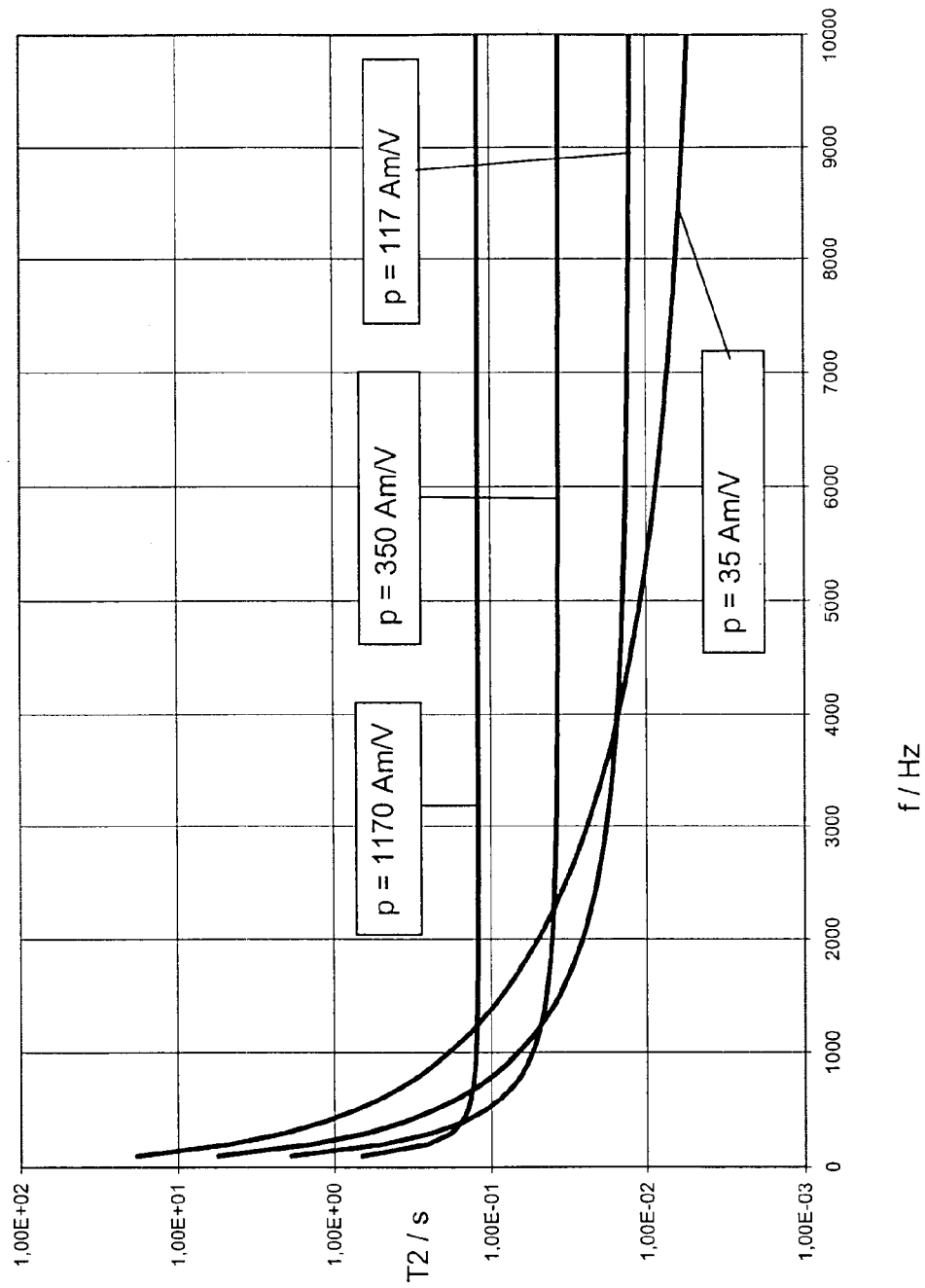
FIG. 5 shows the theoretically determined dependence of the damping time constant as a function of the frequency of a mechanical oscillation of tubular components with inventive cylindrical elements for different products p.

FIG. 5 shows the functions T2(f) for different values for the product p (which also defines the angular frequency $\omega_0$) for an oscillatory component in a magnetic resonance apparatus having the characteristic values:
D=0,05 m,
E=5×10$^{10}$ Pa,
R2=0,2 m,
B=7 T.

For frequencies f above 1000 Hz damping time constants T2 in the region between 10 ms and 100 ms can be achieved with the inventive means, thereby effectively reducing structure-borne noise.

It should be noted that the dampings which are induced with the inventive means are determined by the electrical currents in the respective cylindrical element which can be calculated within the scope of the formalism stated herein but which also produce additional disturbing magnetic fields which can, in principle, interfere with the function of the magnetic resonance apparatus. These currents or the magnetic fields connected therewith are usually very small compared to the magnetic fields directly produced by the gradient system. The disturbance fields can be kept particularly small by selecting the angular frequency $\omega_0$ to be larger than the angular frequency ω to be damped. Even then, good damping can be achieved, in particular for higher frequencies. In general the methods described in the document P. Jehenson, M. Westphal, N. Schuff, J. Magn. Res. 90, 264–278 (1990) can be used, with suitable modifications, for compensating such disturbance fields.

We claim:

1. A magnetic resonance (MR) apparatus for receiving an investigational object, the apparatus comprising:
    a main field magnet system having a tubular opening for receiving the investigational object;
    at least one tubular component disposed within said tubular opening; and
    at least one cylindrical element, said cylindrical element disposed within and surrounded by said main field magnet system, said cylindrical element in rigid mechanical connection with said tubular component, wherein a products p of an electrical conductivity σ, a cylinder radius R, and a wall thickness d of said cylindrical element or a sum of products p of an electrical conductivity σ, a cylinder radius R, and a wall thickness d of each of said cylindrical elements is between 1 Am/V and 10,000 Am/V.

2. The apparatus of claim 1, wherein said product or sum of products p is between 10 Am/V and 1,000 Am/V.

3. The apparatus of claim 2, wherein said product or sum of products p is between 20 Am/V and 500 Am/V.

4. The apparatus of claim 1, wherein said tubular component is a gradient coil system.

5. The apparatus of claim 1, wherein said cylindrical element and said tubular component form an integral mechanical component.

6. The apparatus of claim 1, wherein said tubular component and said cylindrical element are cast with a solidified and hardened casting compound to form one single mechanical unit.

7. The apparatus of claim 6, wherein said casting compound is a solidified artificial resin which is reinforced by one of fiber glass and carbon fibers.

8. The apparatus of claim 1, wherein said at least one cylindrical element comprises carbon fiber material.

9. The apparatus of claim 8, wherein said at least one cylindrical element consists essentially of carbon fiber material.

10. The apparatus of claim 1, wherein said at least one cylindrical element consists essentially of a metallic alloy.

11. The apparatus of claim 10, wherein said metallic alloy comprises at least one of a copper alloy and an aluminum alloy.

12. The apparatus of claim 1, wherein said at least one cylindrical element consists essentially of non-magnetic steel.

13. The apparatus of claim 1, wherein said cylindrical element is a seamless metal pipe.

14. The apparatus of claim 1, wherein said at least one cylindrical element is formed of several radially sequential layers.

15. The apparatus of claim 14, wherein said cylindrical element consists essentially of a metal foil which is wound in several layers.

16. The apparatus of claim 14, wherein said cylindrical element consists essentially of several separate sheet metals which overlap each other over large areas.

17. The apparatus of claim 14, wherein said cylindrical element is formed of a multi-layer plastic compound with embedded electrically conducting structures.

18. The apparatus of claim 1, further comprising a cooling means for cooling said at least one cylindrical element.

19. The apparatus of claim 4, wherein said cylindrical element is in thermal contact with a cooling means of said gradient coil system.

20. The apparatus of claim 4, wherein several cooling means are provided for said gradient coil system and each cooling means is provided with a cylindrical element in thermal contact therewith.

21. The apparatus of claim 4, wherein said cylindrical element is disposed radially outside of gradient coils of said gradient coil system.

22. The apparatus of claim 4, wherein said gradient coil system is actively shielded and comprises a shielding coil system.

23. The apparatus of claim 4, wherein said shielding coil system is rigidly mechanically connected to gradient coils of said gradient coil system, said cylindrical element being disposed radially outside of said shielding coil system.

24. The apparatus of claim 1, further comprising a sound-absorbing tubuiar capsule which at least partially radially surrounds a gradient coil system of the apparatus in at least one of an axial and a radial manner, wherein said at least one cylindrical element is rigidly mechanically connected to said tubular capsule.

25. The apparatus of claim 1, wherein said cylindrical element itself is said tubular component and is disposed radially inside a gradient coil system of the apparatus.

* * * * *